(12) United States Patent
Xia et al.

(10) Patent No.: US 6,514,850 B2
(45) Date of Patent: Feb. 4, 2003

(54) INTERFACE WITH DIELECTRIC LAYER AND METHOD OF MAKING

(75) Inventors: Li-Qun Xia, Santa Clara, CA (US); Huong Thanh Nguyen, San Ramon, CA (US); Ellie Yieh, San Jose, CA (US); Dan Maydan, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 09/775,010

(22) Filed: Jan. 31, 2001

(65) Prior Publication Data
US 2002/0102856 A1 Aug. 1, 2002

(51) Int. Cl.$^7$ ............................................. H01L 21/4763
(52) U.S. Cl. ..................... 438/622; 438/694; 438/623; 438/687; 438/637; 438/99
(58) Field of Search ................................. 438/694, 622, 438/623, 637, 634, 781, 624, 778, 780, 718, 725, 687, 99

(56) References Cited

U.S. PATENT DOCUMENTS

| | | | | |
|---|---|---|---|---|
| 4,579,623 A | * | 4/1986 | Suzuki et al. ............... 118/50.1 |
| 5,097,133 A | * | 3/1992 | Nam et al. ............... 250/370.01 |
| 5,976,970 A | | 11/1999 | Dalal et al. .................... 438/637 |
| 5,977,638 A | | 11/1999 | Rodgers et al. .............. 257/773 |
| 6,030,901 A | * | 2/2000 | Hopper et al. .......... 204/192.36 |
| 6,030,904 A | * | 2/2000 | Grill et al. .................... 438/623 |
| 6,033,979 A | * | 3/2000 | Endo ............................ 438/622 |
| 6,048,790 A | | 4/2000 | Iacoponi et al. ............. 438/643 |
| 6,054,206 A | | 4/2000 | Mountsier ................. 428/312.8 |
| 6,059,940 A | | 5/2000 | Nogami et al. ......... 204/192.15 |
| 6,066,574 A | * | 5/2000 | You et al. .................... 438/778 |
| 6,159,871 A | | 12/2000 | Loboda et al. ............... 438/786 |
| 6,168,726 B1 | * | 1/2001 | Li et al. ......................... 216/67 |
| 6,278,147 B1 | * | 8/2001 | Dalton et al. ................ 257/295 |
| 6,346,475 B1 | * | 2/2002 | Suzuki et al. ................ 438/622 |
| 6,429,122 B2 | * | 8/2002 | Chooi et al. ................. 438/637 |

OTHER PUBLICATIONS

U.S. patent application Ser. No. 09/553,461, filed Apr. 19, 2000 Entitled "Method of Depositing Low K Films Using an Oxidizing Plasma" 39 pages.

Applied Materials manual, titled *"Centura Optical Endpoint System Manual"* Part No. 0230–32587, Jun. 9, 1996.

Ruth DeJule, entitle *"Dual–Damascene: Overcoming Process Issues,"* Semiconductors.net, date downloaded Aug. 2, 2000, pp 1–7 (note: original date unknown).

"Copper, With and Without Damascene" Copper and Damascene, Semiconductors.net, date downloaded May 2, 2000, pp 1–4 (note: original date unknown).

Novellus Damascus—Step 1—Diffusion Barrier/Etch Stop, date downloaded Jul. 24, 2000 (note: original date unknown).

* cited by examiner

Primary Examiner—Matthew Smith
Assistant Examiner—V. Yevsikov
(74) *Attorney, Agent, or Firm*—Moser, Patterson & Sheridan

(57) ABSTRACT

Methods of forming an interface in a dielectric material to act as an indicator for terminating an etching process, and products produced thereby.

29 Claims, 5 Drawing Sheets

INTERFACE WITH DIELECTRIC LAYER AND METHOD OF MAKING

FIELD OF THE INVENTION

The field of the present invention pertains to treatment of dielectric materials to improve the etching characteristics thereof, improved etching techniques resulting therefrom, and improved semiconductor devices.

BACKGROUND OF THE INVENTION

As integrated circuits (IC's) become more compact, dense and powerful, this necessarily also has decreased and continues to decrease the distances between adjacent components and interconnects. Due to this increasing density and the need for faster speeds, copper and copper alloys are again receiving attention as materials of choice for interconnects. Copper offers advantages over aluminum in that it has a lower resistivity than aluminum and exhibits superior electromigration properties.

Dual-damascene is a technique of inlaying metal for interconnects and wiring through the back end, which was developed due to difficulties presented in copper etch processes. The damascene process includes etching a trench with a high aspect ratio (e.g., approaching 6:1), filling the trench with copper, such as by electrochemical plating, for example, and them removing any overfill by chemical mechanical polishing (CMP), for example. The term "dual" refers to the formation of a via within the trench.

Currently, a hard mask formed of $Si_3N_4$ or SiC, for example, may be used to form an etch stop which defines the bottom of the trench and/or via as it is formed. Although this type of etch stop may be effective in simplifying the etch process during the formation of the trench and the via, these hard mask materials generally are characterized by a "k" value of around 5 to 7. Since the hard mask material remains after the etching process, the effective k value of the resulting dielectric stack is increased by the presence thereof, particularly when low k dielectrics are used.

Accordingly, there is a continuing need for better dielectric stacks with more density capacity and therefor a need for improved processes which lessen the effect of increasing the k value of the resultant dielectric stack.

SUMMARY OF THE INVENTION

An embodiment of the present invention provides a method of forming an interface to serve as an endpoint for an etching procedure. The method includes providing a substrate formed of a low k material, and transforming a surface layer of the substrate to chemically alter its structure, so that during etching, spectrographic monitoring will indicate when the etching process passes through an upper layer of low k material and into the transformed surface layer.

The transforming step may include subjecting the substrate to a plasma bombardment, where the plasma may be a nitrogen plasma, oxygen plasma, helium plasma, argon plasma or plasma formed from another inert gas.

The substrate may be a C-doped silicon material, where the transforming by a nitrogen plasma changes the surface layer from a Si—C—O material to a material having a Si—N—O,

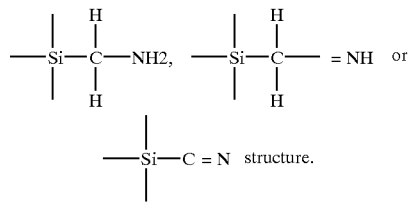

Such a transformed surface layer may be less than or equal to about 200Å thick and does not significantly change the k value of the material.

The substrate may also be treated by an oxygen plasma, wherein the surface layer is transformed into an oxide. The surface layer in this case exhibits a slightly higher k value than the substrate, but is still significantly lower than the k value of etch stop layers currently in use. Such an oxide surface layer may be less than or equal to about 500 Å.

The substrate may also be treated by an helium plasma, or other plasma formed from an inert gas, e.g., argon wherein carbon atoms are knocked out of the surface layer to leave vacancies. While such a transformation generally lowers the k value of the surface layer, the practical effect, upon depositing another layer of low k material over the surface layer, is that the surface layer compresses to form a material with a slightly higher k value than the remainder of the layer. However, the k value is still significantly lower than the k value of etch stop layers currently in use.

A method of dual damascene processing is disclosed which includes depositing a low k material layer on an etch stop layer; transforming a surface layer of the low k material layer to alter the chemical composition thereof; and depositing an additional amount of the low k material over the transformed surface layer.

Additionally, the method may include etching a via through the additional low k material, the transformed surface layer and the low k material layer, and ending at an interface with the etch stop layer.

Further, a step of etching a trench through the additional low k material and ending at an interface with the transformed surface layer is provided. Both trench-first and via-first process are included in the present invention, as well as other dual damascene techniques.

Products made by the above methods, are also included, such as a product including a first layer of low k material having a transformed surface layer having a chemical formula different from a remainder of the first layer; and a second layer of low k material layer deposited over the transformed surface layer.

Such products are further described to include an etch stop layer, wherein the first layer of low k material has been deposited on the etch stop layer.

According to the present invention, a stacked layer structure is provided, which includes an etch stop layer; a low k material layer deposited on the etch stop layer and including a transformed surface layer having a chemical formula different from a remainder of the low k material layer; an additional low k material layer deposited over the transformed surface layer; a via passing through the additional low k material layer, the transformed surface layer and the low k material layer and terminating at an interface with the etch stop layer; and a trench passing through the additional low k material layer and terminating at an interface with the transformed surface layer.

DETAILED DESCRIPTION OF PREFERRED EMBODIMENTS

Figure 1:
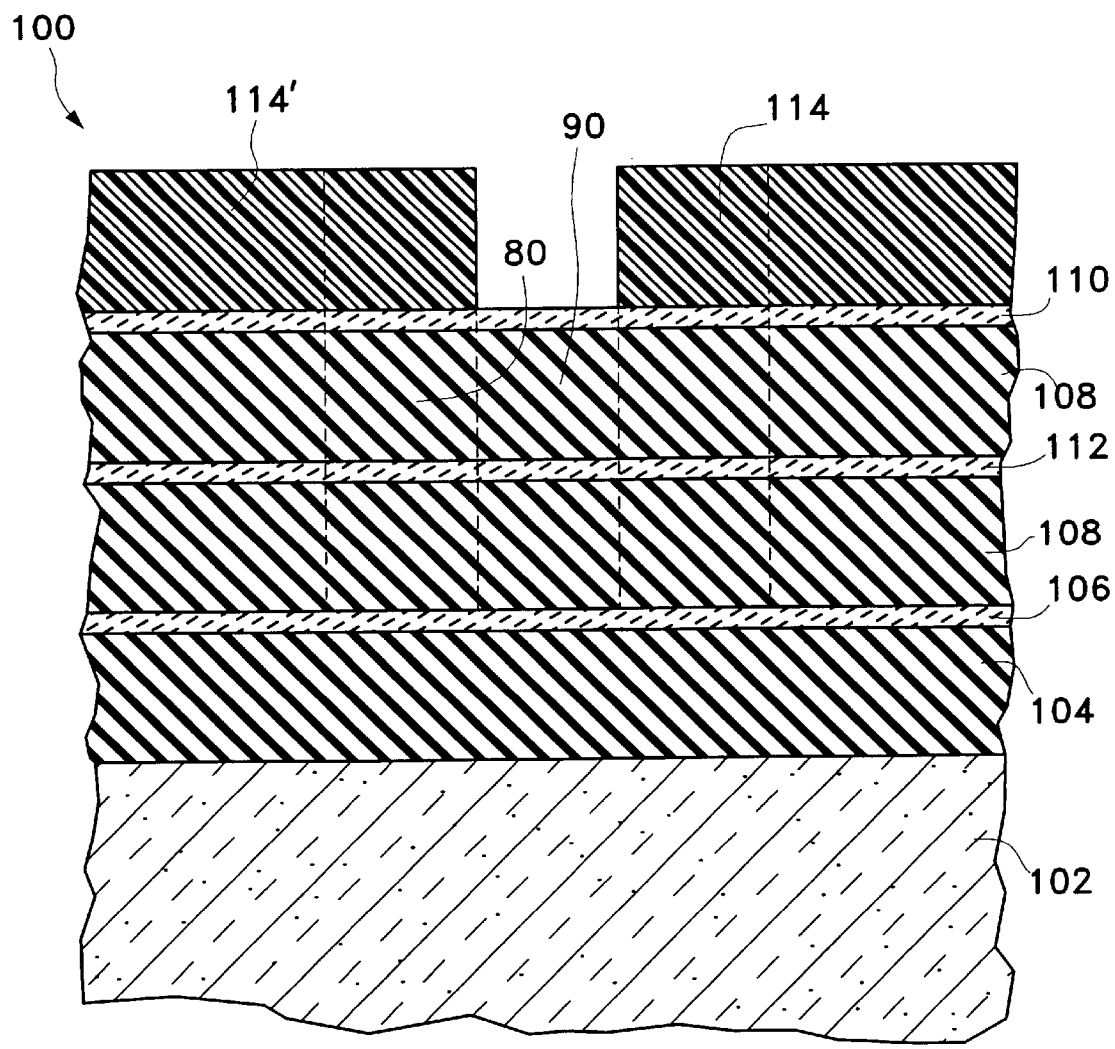
FIG. 1 is a schematic, sectional partial representation of a stack during dual damascene processing according to a prior art technique.

Before the present methods, treated surfaces, and dielectric stacks are described, it is to be understood that this invention is not limited to particular methodologies, materials and substrates and can, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

DEFINITIONS

The term "dielectric" as used herein refers to a material in which an electric field can be maintained with zero or near-zero power dissipation, i.e., the electrical conductivity is zero or near zero.

The term "capacitor" as used herein refers to a passive electronic component that stores energy in the form of an electrostatic field. In its simplest form, a capacitor consists of two conducting plates, or electrodes, separated by a dielectric layer.

The term "etch stop" refers to a layer which is deposited on or intermediately in a layer, and is of a different material than a layer overlying the etch stop, and preferably has characteristics which render its etch rate much slower than that of the material overlying it. The result is that the etch stop provides a clear indicator of when to end a particular etching process.

The term "integrated circuit" as used herein refers to an electronic circuit having multiple individual circuit elements, such as transistors, diodes, resistors, capacitors, inductors, and other active and passive semiconductor devices, formed on a single chip of semiconducting material and mounted on a single piece of substrate material.

The term "low k" and "low k material" refers to dielectric materials having a dielectric constant (i.e., "k") less than about 3.0 for a dielectric material (e.g., Black Diamond™ has a k value of about 2.8) and k less than about 5 for a barrier material (e.g. Blok™ has a k value of about 4.2–4.5).

The following abbreviations are used throughout the specification:

PVD is used for physical vapor deposition.

CVD is used for chemical vapor deposition.

BLOk™ is a proprietary barrier material formed from TMS and helium and is used for a barrier to Cu. BLOk™ has a low k value compared to nitride.

TEOS is an acronym designating tetraethoxysilane.

Turning now to FIG. 1, a schematic partial representation 100 of a stack during dual damascene processing according to a prior art technique is shown. A typical stack includes an oxide layer 104, such as TEOS, for example, on a substrate 102, which is generally silicon. A first etch stop layer 106 is formed on the oxide layer 104. Etch stop layer 106 is typically a nitride layer such as $Si_3N_4$, or may be SiC, for example. A low k material layer 108, into which the vias and trenches will be formed, is deposited on top of the etch stop layer 106. A second etch stop layer 110, which may be made the same as the first etch stop layer 106, is deposited on top of the low k material and photoresist layers are deposited on top of the second etch stop layer 110, as various etching procedures progress. For example, a photo resist mask 114 is deposited for formation of the vias 90 (shown in phantom lines).

Typically, afer depositing of the photoresist layer 114, the via 90 is etched and then the photoresist 114 is stripped using plasma etching or wet techniques. Next, another photoresist mask 114' is deposited to identify where the trenches 80 (trench 80 is also outlined in phantom) will be etched into the low k layer 108. Because the trenches 80 are not as deep as the vias 90, the etch stop layer 106 is not useful in determining a stopping point or "bottom" of the trench 80 during the etching process. Thus, a third etch stop layer 112, which may be made the same as the first etch stop layer 106, is deposited intermediately of the low k material 108, at a depth where the bottoms of the trenches 80 are intended to terminate. Accordingly, an end point for the trench etching procedure is obtained in the same manner as the end pointing for the via etching procedure.

As noted above, however, the use of an etch stop layer 112, raises the effective k value of the low k layer 108 and the entire stack formation, resulting in reduced performance of the resultant product. For example, a typical oxide layer 104 has a k value of about 4; a low k material such as Black Diamond™, (a composition comprising TMS/0$_2$, TMS/0$_3$, TMS/N$_2$0, MS/N$_2$0, (supplied by Airproduct, Allentown, Pa.), has a k value of about 2.8, or BLOk™ ( a composition comprising TMS/He or TMS/NH$_3$/He, also supplied by Air product) has a k value of about 4.2–4.8; while an etch stop material such as a nitride has a k value of about 7.

Figure 2:
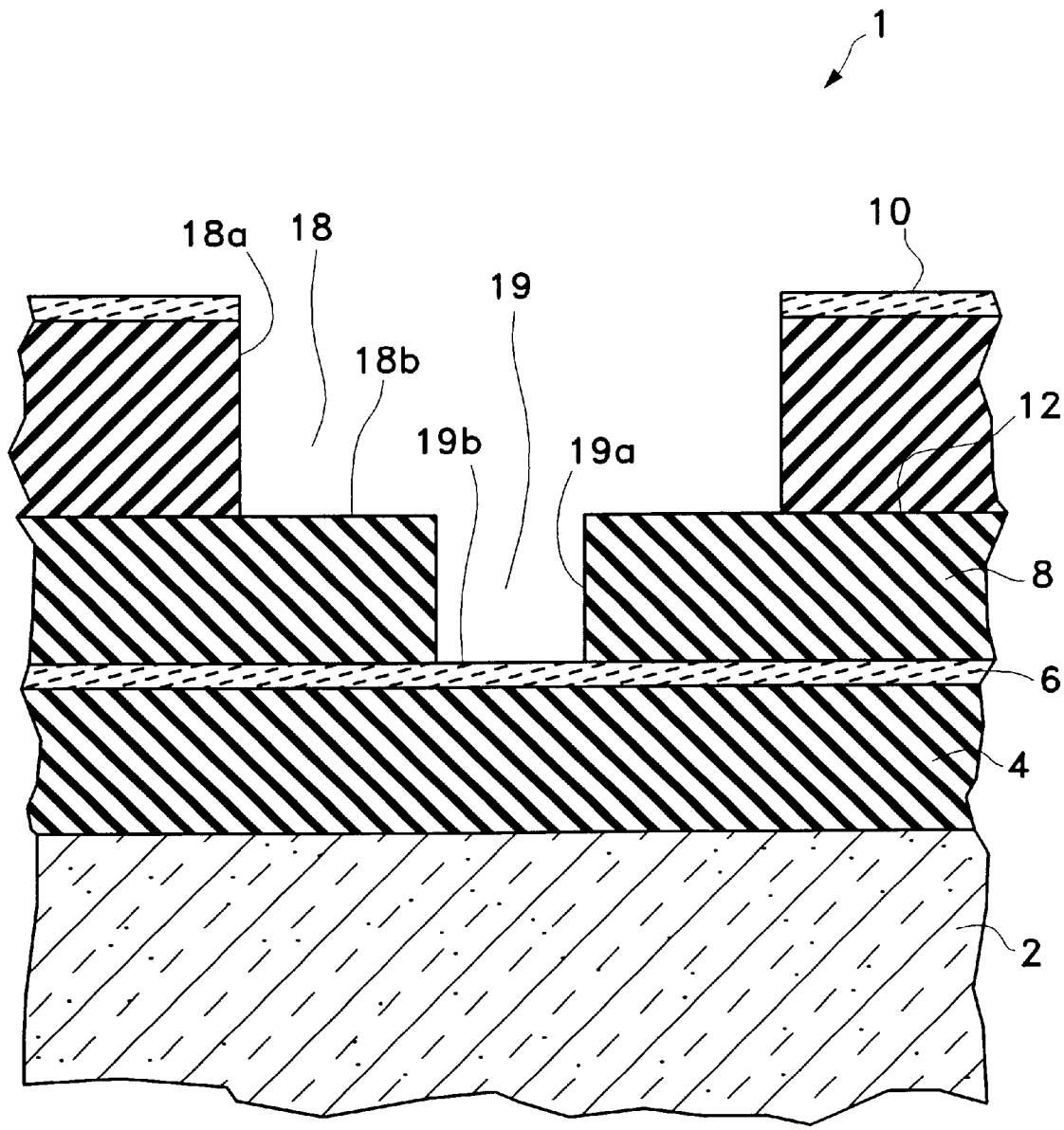
FIG. 2 is a schematic, sectional partial representation of a stack formed by dual damascene processing according to the present invention.

In order to lower the overall k value of the stack formation and thus improve the performance of the dielectric stack and thus, the performance of capacitors and integrated circuits produced therefrom, the present invention eliminates the third etch stop layer in its form used in the prior art described above. FIG. 2 is a schematic, sectional partial representation of a stack 1 after formation of both the trench 18 and via 19 according to the present invention. Critical to damascene processing are substantially vertical walls (e.g., about 89–90°) with smooth sidewalls.

A typical stack 1 includes an oxide layer 4, such as TEOS, for example, on a substrate 2, which may be silicon, for example. A first etch stop layer 6 is deposited on the oxide layer 4, and serves to identify the end point for stopping etching of the via 19 to end at the bottom surface 19b. Although etch stop layer 6 may be formed of a nitride layer such as Si$_3$N$_4$, or may be SiC, it is preferred to use BLOk™, which has a lower k value of about 4.8. A low k material layer 8, such as Black Diamond™, which has a k value of about 2.8, or other C-doped material, for example, is deposited on top of the etch stop layer 6. The vias 19 and trenches 18 are etched into the low k layer 8. A second etch stop layer 10, which may be made the same or of a different material than the first etch stop layer 6, is deposited on top of the low k material 8 and photoresist layers may then be deposited on top of the second etch stop layer 10, as various etching procedures progress. In FIG. 2, all photoresist materials have already been removed, the trench 18 and via 19 already having been fully formed.

In order to keep the dielectric constant k of the material 8 (as well as the overall structure) low, the configuration of FIG. 2 does not use a third etch stop layer, contrary to that of the arrangement in FIG. 1. Rather, in the present invention, the low k material is treated at the level where the bottom 18b of the trench 18 is to be formed so as to achieve a different chemical composition of the surface layer 12 of the low k material at that level, which will indicate an endpoint to an endpoint detector as the etching process comes into contact with it, while at the same time not significantly effecting or increasing the k value of the low k layer 8 compared to the effects of prior art etch stop layers, such as that described with regard to FIG. 1, for example. Ideally, one would eliminate the stop layer altogether, but then there would be no reference point to stop the etching of the trench 19.

Figure 3:
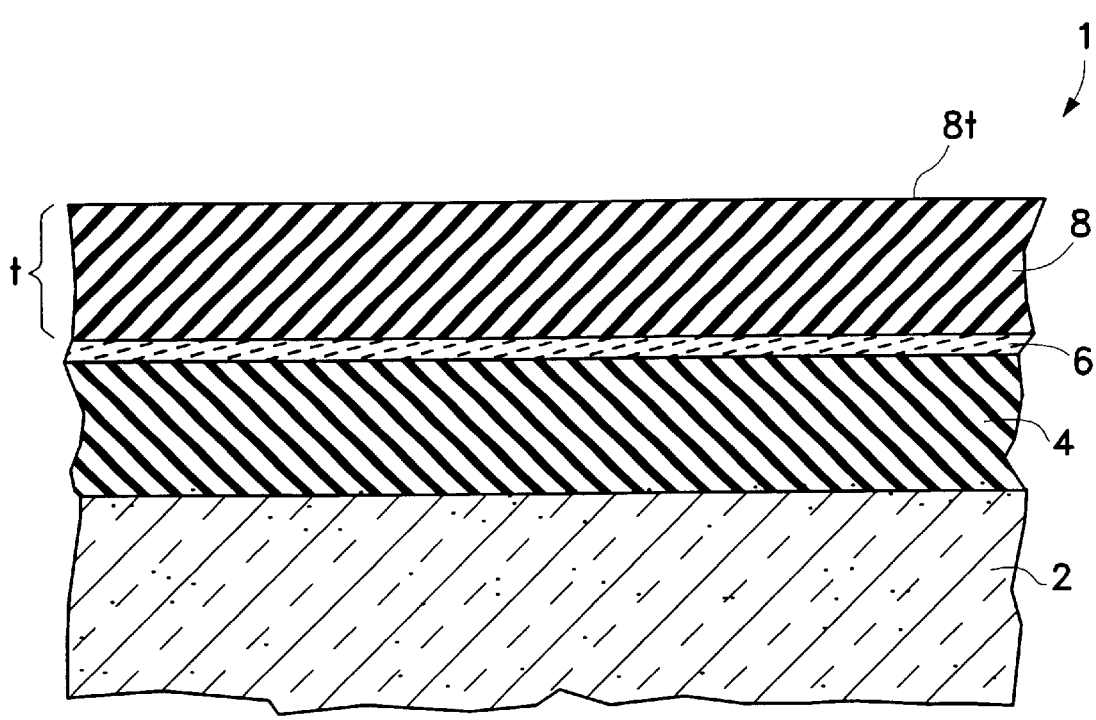
FIG. 3 is a schematic, sectional partial representation of an intermediate step in forming the stack shown in FIG. 2.
Figure 4:
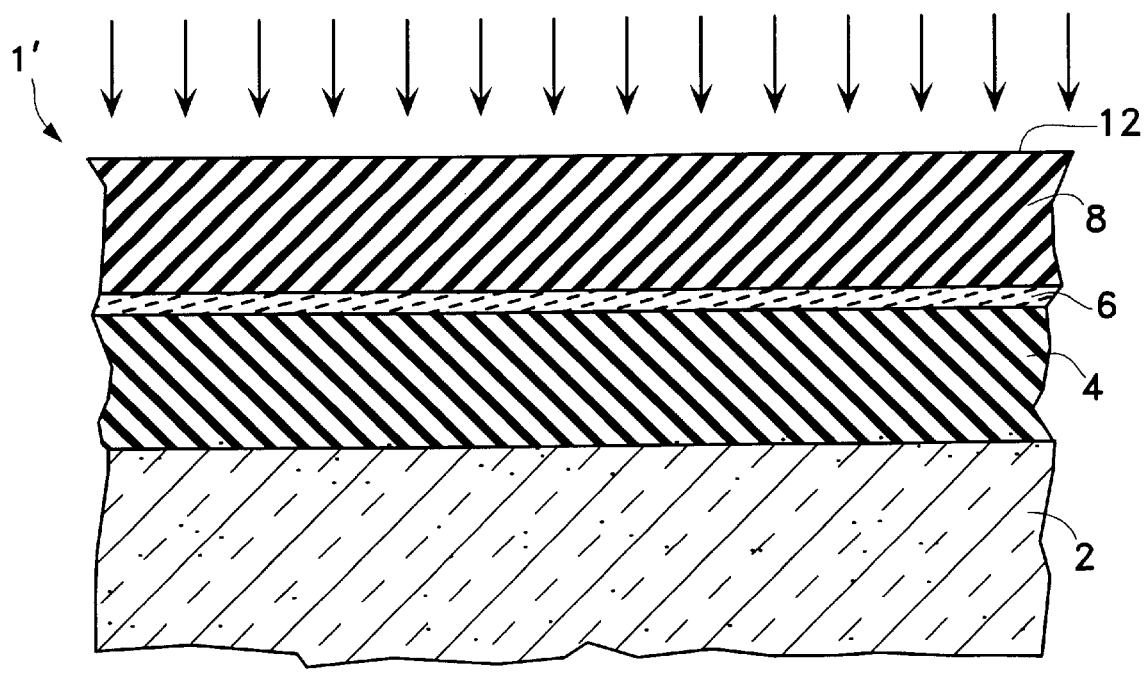
FIG. 4 is a schematic, sectional partial representation of an intermediate step in forming the stack shown in FIG. 2.

FIG. 3 shows the stacking arrangement in preparation for the formation of the surface layer 12. The low k material is deposited to have a thickness "t" that will define a height difference between the bottom of the trench 19b and the first etch stop layer 6. The top surface of this deposition layer of low k material 8 is next processed to form the surface layer 12, as shown in FIG. 4. The stack 1 may be subjected to nitrogen plasma treatment. For example, the stack 1 may be placed on the chuck of a plasma treatment chamber and subjected to plasma treatment produced by flowing He at about 2000 sccm and N$_2$ at 500 sccm into the chamber where the pressure is controlled to about 1.5 torr and RF$_1$ energy (13.56 Khz) or RF$_2$ energy (356 KHz) is applied at about 700 watts to form the plasma. The temperature of the chuck is maintained at about 400° C., and plasma processing is carried out for about 120 seconds. Of course, all of the foregoing parameters are only an example and can be varied, to produce varying layer thicknesses, for example. Carbon atoms in the surface layer of the material 8 are sputtered off and replaced by nitrogen atoms, thereby transforming the surface layer from a Si—C—O type material to a material having a Si—N—O,

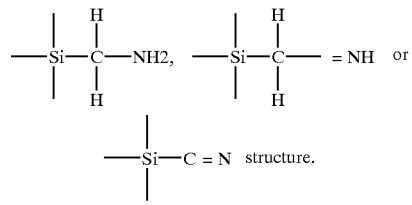

Also, the plasma bombardment is a compressive treatment producing a treated layer under compression, which reduces the overall film stack stress.

The chemical structure of the newly transformed layer 12 will then signal an end pointing detector, upon reaction with the etchant, that the end point has been reached. Only the surface layer 8t of the low k material 8 is transformed, so that only a very thin layer, e.g., less than or equal to about 200 Å thick, will reside between portions of the low k material. As a result, the effect of the surface layer 12 on the k value of the low k material is negligible.

Figure 5:
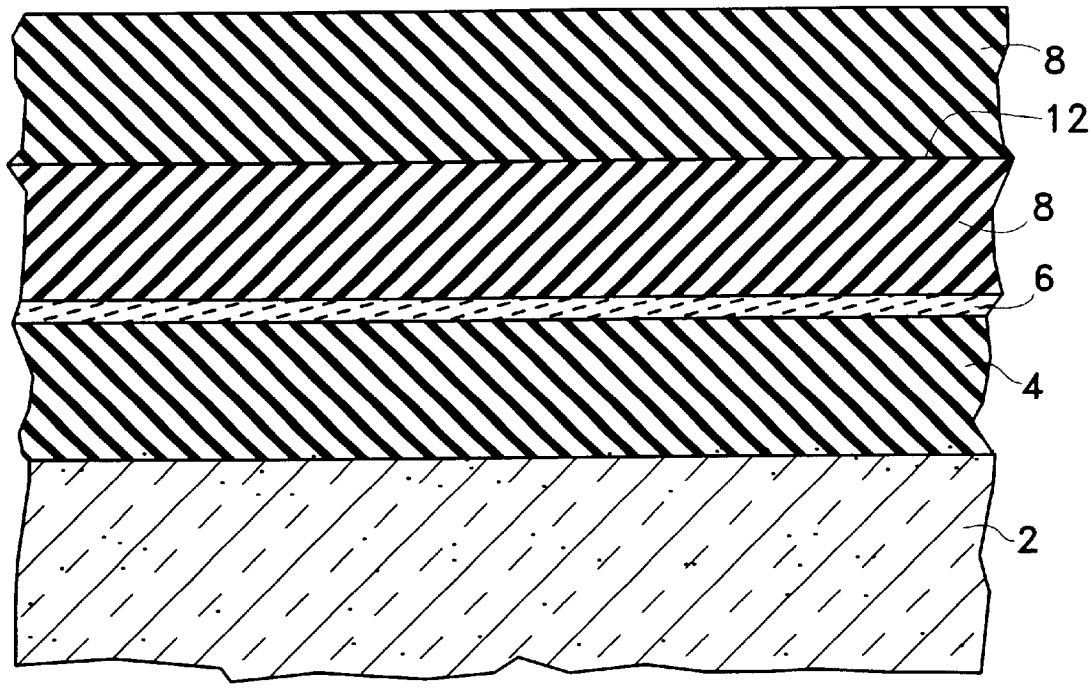
FIG. 5 is a schematic, sectional partial representation of an intermediate step in forming the stack shown in FIG. 2.
Figure 6:
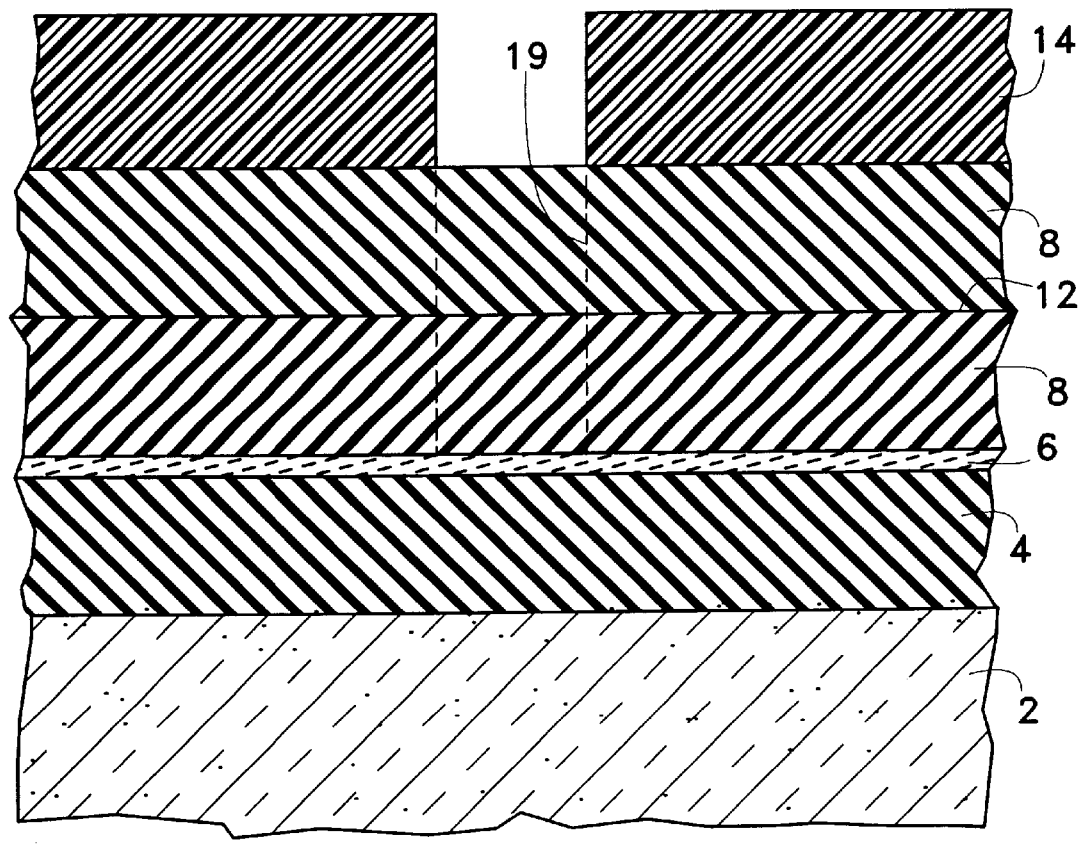
FIG. 6 is a schematic, sectional partial representation of an intermediate step in forming the stack shown in FIG. 2.

After formation of the transformed layer 12, the remainder of the low k material is deposited as shown in FIG. 5. Next, a photoresist mask 14 is deposited onto the low k layer 8 by known techniques, in preparation for the etching step used to form the via 19 (shown in phantom). Etching is then commenced, according to techniques currently known in the art, for example, and an end point monitor, for example, an Eye-D™ end point detector (supplied by Applied Materials, Santa Clara, Calif.) is used to monitor the etch process. A further description of an exemplary end point monitor used can be found in the Applied Materials manual titled "Centura Optical Endpoint System Manual", Part No. 0230-32587, Jun. 9, 1996, which is incorporated herein in its entirety, by reference thereto. Standard oxide etchants, such as CF4, C2F6 and/or CHF3 may be used in the etching procedure as are known in the art. However, oxygen is also added to these etchant materials in order to provide an effective etchant for the low k material. The effect of adding oxygen is to relatively increase the etch rate of the low k materials, while also relatively decreasing the etch rate of oxide materials and nitride materials. Densified layers will also have a relatively lower etch rate, as would be expected.

A monitoring wavelength is selected, which the end point detector monitors during the etching procedure. For example, in this instance, a wavelength of around CN 386.2 nm is monitored, although the particular wavelength may vary, of course, depending upon the calibration of the device being used and the particular compositions of the materials being etched. As the etching proceeds through the upper layer of the low k material, the CN 386.2 value drops and continues on a decreasing slope until the etch stop or marker layer 6 is reached. The downslope in the value of the wavelength monitored is a natural occurrence resulting from the etching. The optical intensity is highest with the greatest thickness, i.e., the starting thickness of the low k layer. Also, as the layer is being etched away, by products are formed which also diminish the value of the monitored peak.

Figure 7:
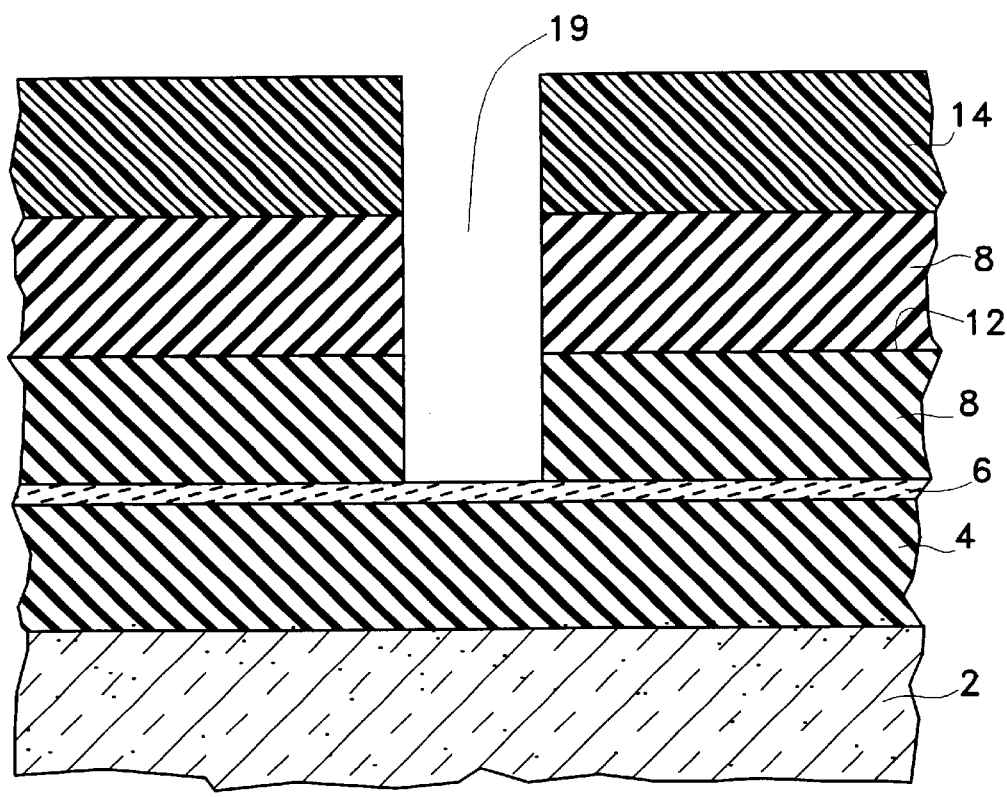
FIG. 7 is a schematic, sectional partial representation of an intermediate step in forming the stack shown in FIG. 2.
Figure 8:
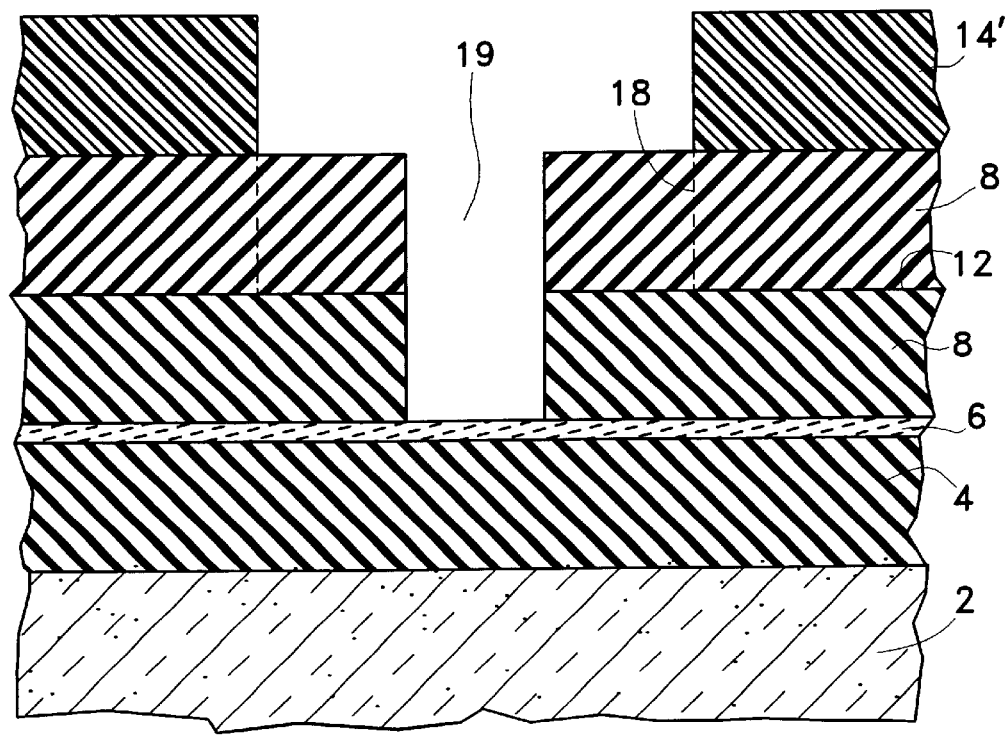
FIG. 8 is a schematic, sectional partial representation of an intermediate step in forming the stack shown in FIG. 2.

As the etching of the etch stop layer 6 begins, the etch rate reduces significantly due to the change in composition of the material, as noted above. The monitored wavelength value at this time levels off, or plateaus as a result and this forms a visual indicator (i.e., the plateau in the graph) that the etch stop layer 6 has been reached. Etching is immediately stopped and the via has now been formed to the desired depth, as shown in FIG. 7. Next, the photoresist layer 14 is removed by plasma etching or other known techniques, and a photoresist mask 14' is then applied to define where the trenches 18 are to be etched out of the low k material 8.

Etching is then commenced, according to techniques currently known in the art, for example, and the end point monitor is used to monitor the etch process until the plateau in the graph monitoring the output in optical intensity of the selected wavelength (e.g., CN 386.2) occurs, as described above. This plateau indicates that the etch stop layer has been reached, and that the etching process has started to react with the transformed surface layer 12. Etching is immediately stopped and the trench 18 has now been formed to the desired depth. Next, the photoresist layer 14' is removed by plasma etching or other known techniques, and the stacked formation 1 appears as in FIG. 2.

Rather than processing the top surface of the deposition layer of low k material 8 by subjecting it to nitrogen plasma treatment to form the surface layer 12 as described above, a transformed surface layer 12 may also be formed by processing the top surface using an oxygen plasma treatment. In this example, the stack 1 may be placed on the chuck of a plasma treatment chamber and subjected to plasma treatment produced by flowing $O_2$ at about 600 sccm into the chamber where the pressure is controlled to about 1.5 to 3.0 Torr. RF2 energy (356 KHz) is applied at from about 100 Watts to about 700 watts to form the plasma. The temperature of the chuck is maintained at about 400° C., and plasma processing is carried out for about 20 to 30 seconds. It has been determined that a variation of the energy applied to form the plasma has a direct relationship on the thickness of the transformation layer that is formed per unit of time. For example, when $RF_2$ energy was supplied at 100 W for 5 seconds, an oxide surface having a thickness of about 20 Å resulted. Comparatively, when $RF_2$ energy was supplied at 600 W for 5 seconds, an oxide surface having a thickness of about 100 Å resulted. Of course, all of the foregoing parameters are only examples and can be varied, to produce varying layer thicknesses, for example. Longer treatment times for any given power input result in a thicker oxide surface than shorter treatment times, given that all other parameters are also the same.

Carbon atoms in the surface layer of the material 8 are sputtered off and replaced by oxygen atoms, thereby transforming the surface layer from a Si—C—O type material to an oxide material having an Si—O, $SiO_2$, Si—OH, or some combination of two or more of the preceding structures. Also, the plasma bombardment is a compressive treatment producing a treated layer under compression, which reduces the overall film stack stress.

The oxide structure, unlike the surface resulting from the nitrogen bombardment, does raise the overall k value of the structure, although not nearly as much as the hard etch stop layers known in the prior art. For example, an oxide surface formed on Black Diamond™ according to this process may have a resultant k value which is about 2.9 to 3.1, as compared with a k value of 2.8 for the Black Diamond™ material itself. This compares very favorably with known hard etch stop layer k values, which are much higher. As noted above, a nitride etch stop layer has a k value of about 7, for example.

The chemical structure of the newly transformed layer 12 will then signal an end pointing detector, upon reaction with the etchant, that the end point has been reached. However, when the surface layer 8t is an oxide layer formed by oxygen bombardment of the low k material 8 a thicker layer is generally required than that resulting from nitrogen bombardment, e.g., less about 500 Å, compared to the 200Å thick layer formed by nitrogen bombardment. This is because the distinct CN plateau which is observed when monitoring reaction with the nitrogen transformed layer, is not monitored. Rather, a CO wavelength is selected for monitoring, e.g., CO 483.5 nm, and the end point detector monitors this wavelength during the etching procedure. Although the wavelength of around CO 483.5 nm is monitored in this example, the particular wavelength may vary, of course, depending upon the calibration of the device being used and the particular compositions of the materials being etched. As the etching proceeds through the upper layer of the low k material, the CO 483.5 value drops and continues on a decreasing slope until the etch stop or marker layer 6 is reached. The downslope in the value of the wavelength monitored is a natural occurrence resulting from the etching. The optical intensity is highest with the greatest thickness, i.e., the starting thickness of the low k layer. Also, as the layer is being etched away, by products are formed which also diminish the value of the monitored peak.

As the etching of the etch stop layer 6 begins, the etch rate reduces significantly due to the change in composition of the material, as noted above. The monitored wavelength value at this time levels off, or plateaus as a result and this forms a visual indicator (i.e., the plateau in the graph) that the etch stop layer 6 has been reached. A thicker oxide layer allows somewhat more time to identify that the oxide layer has been reached in the etching process. Etching is immediately stopped and the via has now been formed to the desired depth, as shown in FIG. 7.

The endpointing for the etching of the channel varies from that described with regard to the nitrogen bombardment example, however, in that an end point monitor is used to monitor the etch process until a plateau in CO 483.5 is observed which indicates that the etching process has started to react with the transformed surface layer 12. Etching is immediately stopped and the trench 18 has now been formed to the desired depth. Next, the photoresist layer 14' is removed by plasma etching or other known techniques, and the stacked formation 1 appears as in FIG. 2.

As another alternative, a transformation of the top surface of the deposition layer of low k material 8 may be effected by subjecting it to a helium plasma treatment to form the surface layer 12. In this example, the stack 1 may be placed on the chuck of a plasma treatment chamber and subjected to plasma treatment produced by flowing He at about 1300 sccm into the chamber where the pressure is controlled to about 6 to 10 Torr. RF2 energy (356 KHz) is applied at from about 600 Watts to about 750 watts to form the plasma. The temperature of the chuck is maintained at about 400° C., and plasma processing is carried out for about 20 seconds.

Carbon atoms in the surface layer of the material 8 are sputtered off by the bombardment. Helium makes the plasma less reactive and therfor there is less chemical attachment, compared to previously described procedures, and more physical attachment of the bombarding particles on the surface. The net result is a densification of the surface, to a depth of around 200–300 Å for example, to form a marker layer 6. This composition when reacting with an etchant and monitored by FTIR spectra, also shows a plateau in a monitored CN wavelength, for example CN 386.2 nm, since the densified layer 6 has a relatively lower etch rate than the low k material that had been etched prior to reaching this layer.

The transformed layer results in a densified material that has a slightly higher k value than the low k material sandwiching it. For example, for surface layer transformed from Black Diamond™ by this process was found to have a k value of about 2.9. As with the oxygen bombardment treatment, the helium bombardment treatment does not raise the overall k value of the structure nearly as much as the hard etch stop layers known in the prior art, which can have a k value of about 7.

The chemical structure of the newly transformed layer 12 will signal an end pointing detector, upon reaction with the etchant, that the end point has been reached. Since the surface layer 8t formed by helium bombardment of the low k material 8 lacks any CN peak indicators under spectroscopy, a thicker layer is generally required than that resulting from nitrogen bombardment, e.g., less about 500 Å, compared to the 200 Å thick layer formed by nitrogen bombardment.

After formation of the transformed layer 12, the remainder of the low k material is deposited as shown in FIG. 5 and discussed above, and the same procedures for apply photoresist masks and for etching are carried out. As the etching is carried out, an end point monitor, for example, an Eye-D™ end point detector (supplied by Applied Materials, Santa Clara, Calif.) is used to monitor the etch process for the CN 386.2 nm wavelength. When a plateau in the graphing of the intensity values read for this wavelength is observed, it indicates that the etching process has started to react with the etch stop layer 6. Etching is immediately stopped and the via has now been formed to the desired depth, as shown in FIG. 7.

The endpointing for the etching of the channel again used the end point monitor to record the optical intensity of a selected wavelength such as CN 386.2. A plot of this intensity over time, from the beginning of the etching of the low k material, shows a down sloping curve, indicating the progressive reduction in thickness of the material as the etching proceeds. The down slop levels off into a plateau as the etching process starts to react with the transformed surface layer 12. Etching is immediately stopped and the trench 18 has now been formed to the desired depth. Next, the photoresist layer 14' is removed by plasma etching or other known techniques, and the stacked formation 1 appears as in FIG. 2.

While the present invention has been described with reference to the specific embodiments thereof, it should be understood by those skilled in the art that various changes may be made and equivalents may be substituted without departing from the true spirit and scope of the invention. For example, although the processing is described above with regard to via first etching, it is noted that the present invention applies equally to trench-first processes as well as other damascene techniques. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method of forming an interface to serve as an endpoint for an etching procedure, said method comprising the steps of:
   providing a substrate formed of a carbon containing material; and
   transforming a surface layer of the substrate to remove carbon atoms so that the surface layer indicates a signature under FTIR that is different from a signature indicated by a remainder of the substrate.

2. The method of claim 1, wherein said transforming comprises creating a plasma from at least one gas selected from the group consisting of nitrogen, oxygen, helium and argon; and bombarding the surface layer with ions created in the plasma.

3. The method of claim 2, wherein said transforming comprises subjecting the substrate to a nitrogen plasma treatment in a chamber during which about 700 Watts of $RF_1$ (13.56 Khz) or $RF_2$ (356 KHz) energy is applied and helium and nitrogen are inputted.

4. The method of claim 3, wherein helium is inputted at about 2000 sccm and nitrogen is inputted at about 500 sccm.

5. The method of claim 3, wherein said transforming is conducted at about 1.5 Torr pressure for about 120 seconds, and a chuck temperature in the chamber is maintained at about 400° C.

6. The method of claim 2, wherein said transforming comprises subjecting the substrate to an oxygen plasma treatment in a chamber during which about 100 to 700 Watts of $RF_1$ (13.56 Khz) or RF2 (356 KHz) energy is applied and helium and oxygen are inputted.

7. The method of claim 6, wherein helium is inputted at about 2000 sccm and oxygen is inputted at about 600 sccm.

8. The method of claim 6, wherein said transforming is conducted at about 1.5 Torr pressure for up to 120 seconds, and a chuck temperature in the chamber is maintained at about 400° C.

9. The method of claim 2, wherein said transforming comprises subjecting the substrate to a helium plasma treatment in a chamber during which about 600 to 750 Watts of $RF_1$ (13.56 Khz) or RF2 (356 KHz) energy is applied and helium is inputted.

10. The method of claim 9, wherein helium is inputted at about 2600 sccm.

11. The method of claim 9, wherein said transforming is conducted at about 8.7 Torr pressure for up to 120 seconds, and a chuck temperature in the chamber is maintained at about 400° C.

12. The method of claim 1, wherein said transforming comprises replacing carbon atoms in the surface layer of the substrate with nitrogen atoms or bonding nitrogen with carbon to form an amine, amide or nitride.

13. The method of claim 1, wherein the substrate is a C-doped silicon material and said transforming changes the surface layer from a Si—C—O material to a material comprising Si—N—O,

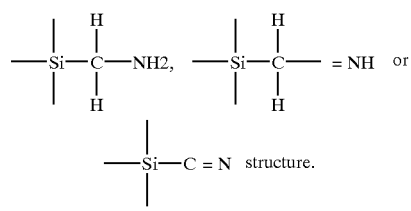

structure.

14. The method of claim 1, wherein the surface layer which is transformed is less than or equal to about 200 Å thick.

15. The method of claim 1, wherein the surface layer which is transformed is about 500 Å thick.

16. A method of dual damascene processing, comprising the steps of:

depositing a low k material layer on an etch stop layer;

transforming a surface layer of the low k material layer to alter the chemical composition thereof;

and depositing an additional amount of the low k material over the transformed surface layer.

17. The method of claim 16, wherein the surface layer is less than or equal to about 500 Å thick.

18. The method of claim 17, wherein the surface layer is about 200 Å thick.

19. The method of claim 16, further comprising:

etching a via through the additional low k material, the transformed surface layer and the low k material layer, and ending at an interface with the etch stop layer.

20. The method of claim 19, further comprising:

etching a trench through the additional low k material and ending at an interface with the transformed surface layer.

21. The method of claim 16, further comprising:

etching a trench through the additional low k material and ending at an interface with the transformed surface layer.

22. The method of claim 21, further comprising:

etching a via through the trench, the transformed surface layer and the low k material layer, and ending at an interface with the etch stop layer.

23. The method of claim 16, wherein said transforming comprises subjecting the substrate to a plasma treatment, wherein the plasma is generated from at least one of the gases selected from the group consisting of nitrogen, oxygen, helium and argon.

24. The method of claim 23, wherein said plasma treatment is a nitrogen plasma treatment which comprises, flowing He and $N_2$ into a plasma treatment chamber at predefined flow rates, and inputting $RF_1$, or $RF_2$ energy at a predefined power and for a predefined time period.

25. The method of claim 16, wherein said low-k material comprises a C-doped silicon material.

26. The method of claim 25, wherein said C-doped silicon material comprises Black Diamond™.

27. The method of claim 16, wherein the etch stop layer is deposited on an oxide layer.

28. The method of claim 27, wherein the oxide layer is deposited on a substrate.

29. The method of claim 16, further comprising depositing a second etch stop layer over the additional amount of low k material.

* * * * *

UNITED STATES PATENT AND TRADEMARK OFFICE
CERTIFICATE OF CORRECTION

PATENT NO. : 6,514,850 B2
DATED : February 4, 2003
INVENTOR(S) : Xia et al.

It is certified that error appears in the above-identified patent and that said Letters Patent is hereby corrected as shown below:

Column 10,
Line 7, please change "transforming" to -- bombarding --.
Line 7, after "substrate", please insert -- with ions created in a plasma --.

Column 12,
Line 18, please change "Diamond$^{TM}$." to -- Diamond$^{TM}$ low k material. --

Signed and Sealed this

Twentieth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO.   : 6,514,850 B2
DATED        : February 4, 2003
INVENTOR(S)  : Xia et al.

It is certified that error appears in the above-identified patent and that said Letters Patent is hereby corrected as shown below:

Column 10,
Line 11, please replace with -- The method of claim 1, wherein said bombarding a surface layer of the substrate with ions created in a plasma comprises creating a plasma from at least one gas selected from the group consisting of nitrogen, oxygen, helium and argon. --
Lines 16, 23, 27, 34, 38, 45 and 49, please change "transforming" to -- bombarding --.
Lines 55-64, please replace with -- The method of claim 1, wherein the substrate is a C-doped silicon material and said bombarding changes the surface layer from a Si-C-O material to a material comprising Si-N-O, Si-C-N, or Si-C=N structure. --
Lines 65-67, please replace with -- The method of claim 1, wherein the surface layer which is bombarded is less than or equal to about 200Å thick. --
Lines 15-67, change numbering scheme of claims 3-14.

Column 11,
Line 1, change numbering scheme of claim 15.
Line 2, change "transformed" to -- bombarded --.

Signed and Sealed this

Sixth Day of July, 2004

JON W. DUDAS
*Acting Director of the United States Patent and Trademark Office*